US010365475B2

(12) United States Patent
Carminati et al.

(10) Patent No.: US 10,365,475 B2
(45) Date of Patent: Jul. 30, 2019

(54) OSCILLATING STRUCTURE WITH PIEZOELECTRIC ACTUATION, SYSTEM AND MANUFACTURING METHOD

(71) Applicant: STMicroelectronics S.r.l., Agrate Brianza (IT)

(72) Inventors: Roberto Carminati, Piancogno (IT); Massimiliano Merli, Stradella (IT); Sebastiano Conti, Pregnana Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 86 days.

(21) Appl. No.: 15/465,742

(22) Filed: Mar. 22, 2017

(65) Prior Publication Data

US 2018/0031823 A1    Feb. 1, 2018

(30) Foreign Application Priority Data

Jul. 28, 2016    (IT) .................. 102016000079604

(51) Int. Cl.
*G02B 27/01*    (2006.01)
*G02B 26/08*    (2006.01)
(Continued)

(52) U.S. Cl.
CPC ....... *G02B 26/0858* (2013.01); *G03B 21/008* (2013.01); *H01L 41/053* (2013.01); *H01L 41/332* (2013.01)

(58) Field of Classification Search
CPC . G02B 26/0858; H01L 41/053; H01L 41/332; G03B 21/008
(Continued)

(56) References Cited

U.S. PATENT DOCUMENTS

| 2011/0109951 A1 | 5/2011 | Goren et al. |
| 2013/0194555 A1 | 8/2013 | Davis et al. |
| 2014/0062506 A1* | 3/2014 | Defazio ............. G02B 26/0841 324/658 |

(Continued)

FOREIGN PATENT DOCUMENTS

| EP | 2706393 A1 | 3/2014 |
| EP | 2808719 A1 | 12/2014 |

(Continued)

OTHER PUBLICATIONS

IT Search Report and Written Opinion for IT 102016000079604 dated Apr. 25, 2017 (10 pages).

(Continued)

*Primary Examiner* — Frank G Font
(74) *Attorney, Agent, or Firm* — Crowe & Dunlevy

(57) ABSTRACT

An oscillating structure with piezoelectric actuation includes first and second torsional elastic elements constrained to respective portions of a fixed supporting body and defining an axis of rotation. A mobile element is positioned between, and connected to, the first and second torsional elastic elements by first and second rigid regions. A first control region is coupled to the first rigid region and includes a first piezoelectric actuator. A second control region is coupled to the second rigid region and includes a second piezoelectric actuator. The first and second piezoelectric actuators are configured to cause local deformation of the first and second control regions to induce a torsion of the first and second torsional elastic elements.

24 Claims, 11 Drawing Sheets

(51) Int. Cl.
*G02B 27/14* (2006.01)
*G03B 21/00* (2006.01)
*H01L 41/053* (2006.01)
*H01L 41/332* (2013.01)

(58) Field of Classification Search
USPC .............................. 359/199.4, 200.8, 214.1
See application file for complete search history.

(56) References Cited

U.S. PATENT DOCUMENTS

| | | | | |
|---|---|---|---|---|
| 2014/0071507 | A1* | 3/2014 | Aimono | G02B 26/0858 |
| | | | | 359/199.4 |
| 2014/0355083 | A1* | 12/2014 | Omoya | B65H 7/14 |
| | | | | 358/498 |
| 2014/0355088 | A1* | 12/2014 | Yasuda | G02B 26/105 |
| | | | | 359/199.4 |
| 2015/0062677 | A1 | 3/2015 | Armbruster et al. | |
| 2015/0175054 | A1 | 6/2015 | Yatsuda et al. | |
| 2015/0277107 | A1* | 10/2015 | Aimono | G02B 26/0858 |
| | | | | 359/198.1 |
| 2016/0116732 | A1* | 4/2016 | Yasuda | G02B 26/085 |
| | | | | 359/200.7 |
| 2017/0293136 | A1* | 10/2017 | Takimoto | H02K 33/18 |

FOREIGN PATENT DOCUMENTS

| | | |
|---|---|---|
| JP | 2006081320 A | 3/2006 |
| JP | 2010204142 A | 9/2010 |
| WO | WO-2012133505 A1 | 10/2012 |

OTHER PUBLICATIONS

"Resonant PZT MEMS scanner for highresolution displays," Article in Journal of Microelectromechanical Systems, Dec. 2012 (9 pages).

* cited by examiner

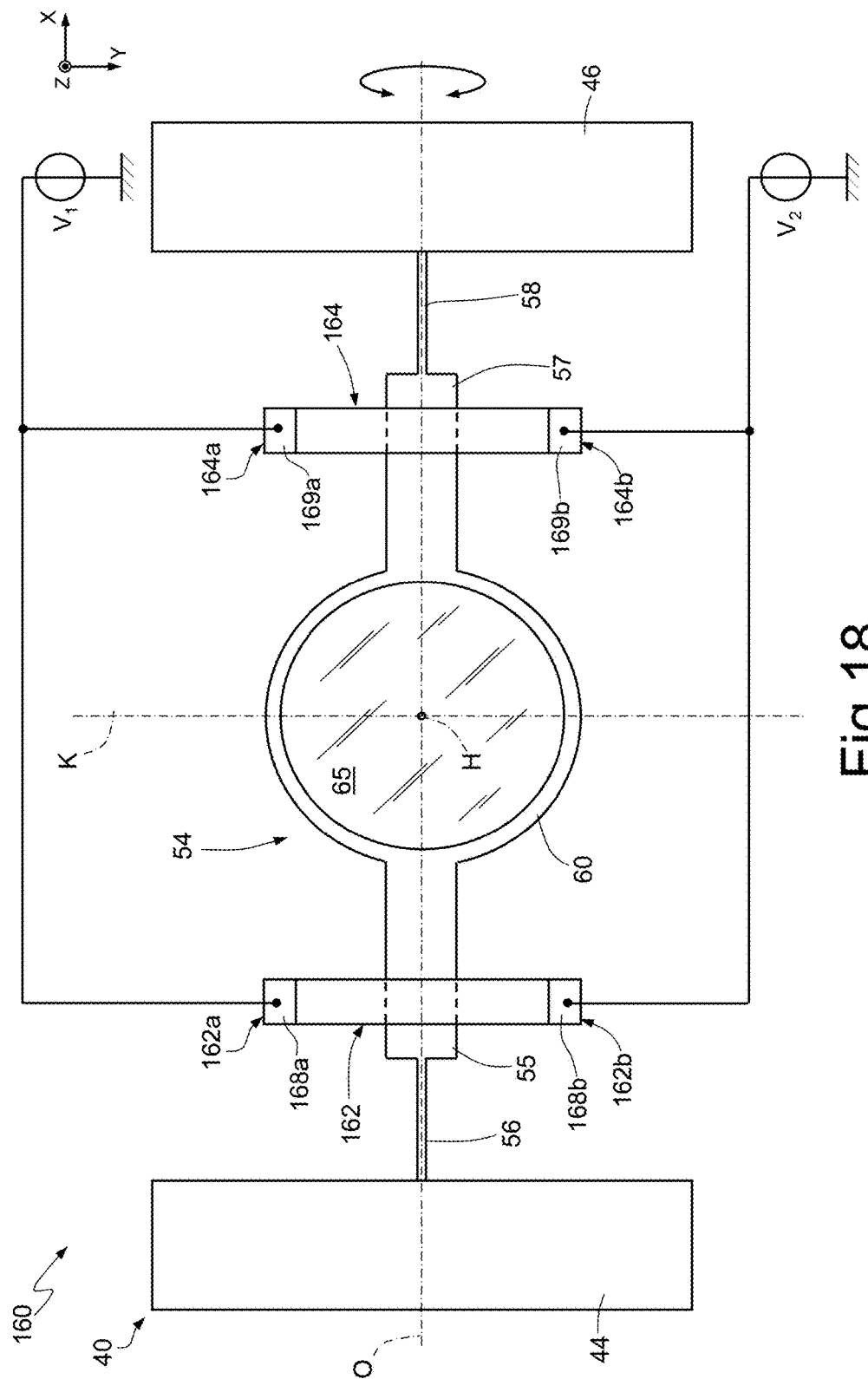

OSCILLATING STRUCTURE WITH PIEZOELECTRIC ACTUATION, SYSTEM AND MANUFACTURING METHOD

PRIORITY CLAIM

This application claims the priority benefit of Italian Application for Patent No. 102016000079604, filed on Jul. 28, 2016, the disclosure of which is hereby incorporated by reference in its entirety.

TECHNICAL FIELD

The present invention relates to an oscillating structure with piezoelectric actuation, to a system including the oscillating structure, and to a method for manufacturing the oscillating structure.

BACKGROUND

It is known to make micromechanical mirror structures (or reflectors), at least in part, of semiconductor materials and obtain employing MEMS (Micro-Electro-Mechanical Systems) technology.

MEMS reflectors are designed to receive an optical beam and to vary the direction of propagation thereof, in a periodic or quasi-periodic way. For this purpose, MEMS reflectors include mobile elements formed by mirrors, the positions of which in space are controlled electrically by appropriate oscillation control signals.

In greater detail, in a generic MEMS reflector comprising a respective mirror, control of the position of the mirror is of particular importance to enable scanning of a portion of space with an optical beam, which is made to impinge on the mirror. In particular, control of the position of the mirror determines in the case of resonant MEMS reflectors, where, in use, the mirror is made to oscillate in a substantially periodic way about a resting position, the period of oscillation being as close as possible to the resonance frequency of the mirror in order to maximize the angular distance covered by the mirror during each oscillation, and thus maximize the extent of the portion of space scanned.

For instance, United States Patent Application Publication No. 2011/0109951 (incorporated by reference) describes a circuit to control of the position of the mirror of a MEMS reflector of a resonant type, said mirror being set for turning, under the action of an actuator of an electrostatic type, about an axis of rotation. In particular, the MEMS reflector disclosed therein comprises a fixed supporting body, made of semiconductor material, and a mirror, which is constrained to the fixed supporting body by torsional springs. An actuator of an electrostatic type typically requires high operating voltages, higher than 150 V or currents in the region of 100 mA, thus limiting the energy efficiency of the final device.

There is a need in the art to provide an oscillating structure with reduced energy consumptions and, at the same time, optimized electromechanical efficiency.

SUMMARY

According to the present disclosure, a system including the oscillating structure and a method for manufacturing the oscillating structure disclosed.

In an embodiment, an oscillating structure with piezoelectric actuation comprises: a first torsional elastic element and a second torsional elastic element constrained to respective portions of a fixed supporting body and defining an axis of rotation; a mobile element arranged between, and connected to, said first and second torsional elastic elements, the mobile element being rotatable about the axis of rotation as a consequence of a torsion of the first and second deformable elements; and a first control region, which is coupled to the mobile element and houses a first piezoelectric actuator, configured to cause, in use, a local deformation of the first control region that generates a torsion of the first and second torsional elastic elements.

In an embodiment, a projective MEMS system comprises: the foregoing oscillating structure; a reflecting element, constrained to the mobile element, designed to reflect a light beam; a light source that can be operated for generating the incident light beam on said reflecting element; and an image-generating module, operatively coupled to said oscillating structure, for generating part of an image associated to a light beam reflected by said reflecting element.

In an embodiment, a method for manufacturing an oscillating structure with piezoelectric actuation comprises the steps of: forming a first torsional elastic element and a second torsional elastic element constrained to respective portions of a fixed supporting body and defining an axis of rotation; forming a mobile element between, and connected to, said first and second torsional elastic elements, the mobile element being rotatable about the axis of rotation as a consequence of a torsion of the first and second deformable elements; forming a first control region coupled to the mobile element; and forming a first piezoelectric actuator coupled to the first control region and configured to cause, in use, a local deformation of the first control region that generates a torsion of the first and second torsional elastic elements.

BRIEF DESCRIPTION OF THE DRAWINGS

For a better understanding of the present invention preferred embodiments thereof are now described, purely by way of non-limiting examples, with reference to the attached drawings, wherein:

FIG. 18 shows an oscillating structure according to a further embodiment of the present disclosure.

DETAILED DESCRIPTION

Figure 1:
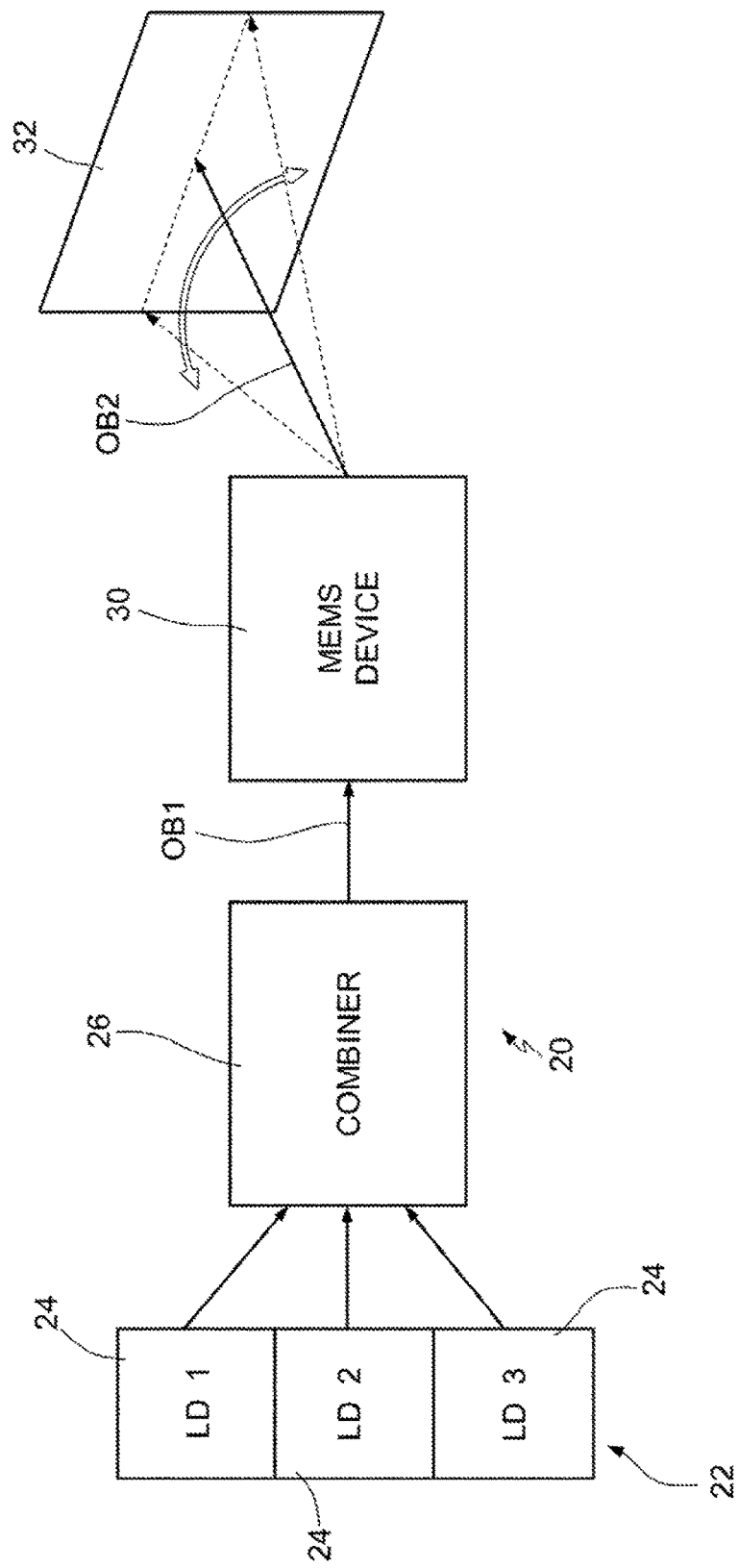
FIG. 1 shows a block diagram of an electronic driving circuit of a MEMS reflector.

FIG. 1 shows a projective MEMS system 20, of a type in itself known, which includes a light source 22 formed, for example, by a plurality of laser diodes (LDs) 24, each of which emits electromagnetic radiation at a corresponding wavelength. For instance, illustrated in FIG. 1 are three LDs 24, each of which emits radiation respectively in the red (620-750 nm) in the green (495-570 nm) and in the blue (450-475 nm).

The projective MEMS system 20 further comprises a combiner 26, a MEMS device 30, and a screen 32. The combiner 26 is set downstream of the light source 22 for receiving the electromagnetic radiation emitted by the LDs 24 and form a single optical beam OB1, obtained by combination of said electromagnetic radiation. The combiner 26 is moreover designed to direct the optical beam OB1 onto the MEMS device 30. In turn, the MEMS device 30, described in greater detail hereinafter, is designed to generate a reflected optical beam OB2 and send the reflected optical beam OB2 onto the screen 32 for enabling formation of images on the screen 32.

In detail, the MEMS device 30 is designed to vary in time the orientation in space of the axis of the reflected optical beam OB2 for scanning periodically portions of the screen 32; in particular, the reflected optical beam OB2 linearly scans possibly an entire portion of the screen 32.

It is evident that the MEMS device 30 may find application in a system different from the one illustrated in FIG. 1.

Figure 2:
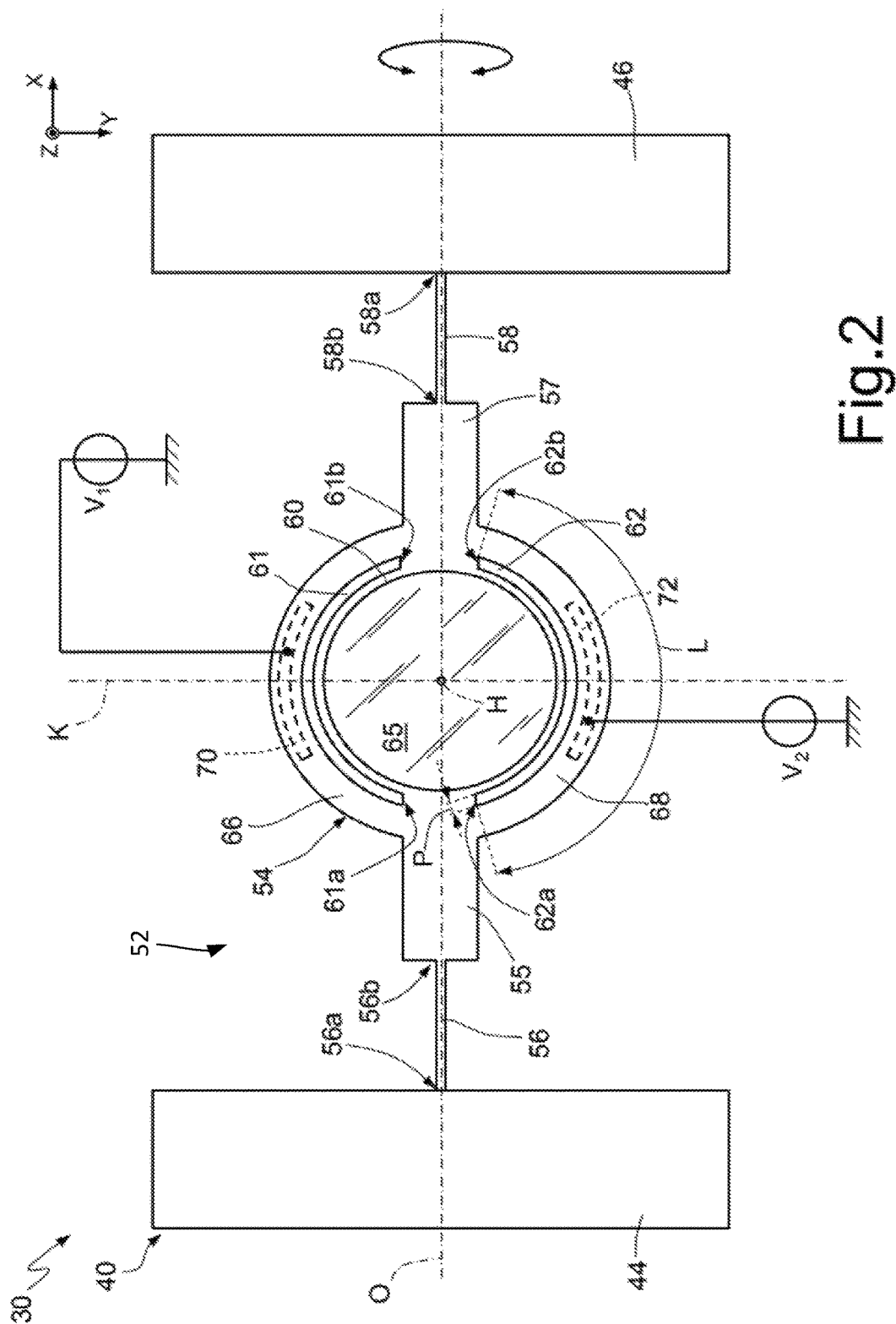
FIG. 2 shows, in top plan view, an oscillating structure according to an aspect of the present disclosure.

FIG. 2 shows an embodiment of the MEMS device 30 according to the present disclosure.

The MEMS device 30 comprises a fixed supporting body 40, in particular made of semiconductor material, which includes a first structural region 44 and a second structural region 46.

The MEMS device 30 is illustrated in an orthogonal reference system formed by three axes X, Y, Z. There is moreover defined an axis H parallel to the axis Z of the reference system. The first and second structural regions 44, 46 are arranged diametrally opposite with respect to the axis H, and aligned with one another along an axis O parallel to the axis X.

The fixed supporting body 40 defines a cavity 52. The MEMS device 30 further comprises a mobile body 54 that is constrained to the first and second structural regions 44, 46 and is moreover suspended over the cavity 52.

The mobile body 54 is mechanically coupled to the first and second structural regions 44, 46 by means, respectively, of a first deformable element 56 and a second deformable element 58, which are in particular configured to undergo a deformation of a torsional type. The mobile body 54 has a central portion 60, for example, circular in top plan view (in the horizontal plane XY), on which a mirror layer 65 is set, made of a material that has a high reflectivity for the light radiation to be projected, such as aluminum or gold. The central portion 60 is coupled to the first and second deformable elements 56, 58 by a respective first rigid connection region 55 and second rigid connection region 57. The first and second connection regions 55, 57 are directly and rigidly connected to the central portion 60 that houses the mirror layer 65. In this context, each of the first and second connection regions 55, 57 are considered "rigid" when it has a constant of torsional stiffness k higher than the constant of torsional stiffness of the first deformable element 56 or of the second deformable element 58, in particular an order of magnitude greater, more precisely twenty times greater, or more.

Precisely, the constant of torsional stiffness k is defined by the following formula: $k=(h^3 bG)/(\beta L)$ where: h is the thickness, along Z, of the element considered; b is the width, along Y, of the element considered; L is the length, along X, of the element considered; G is the shear modulus (the value of which depends upon the material used and, in the case of silicon, varies between 50.92 GPa and 79.4 GPa according to the crystallographic plane considered); and $\beta$ is a numeric parameter that depends upon the aspect ratio of the element considered; i.e., it is a function of the ratio between the width b and the thickness h. It is here assumed that both the first and second connection regions 55, 57 and the first and second deformable elements 56, 58 have a quadrangular cross section, in particular a rectangular cross section, with a thickness h and a width b such that h≤b, in particular h<b.

The value of $\beta$ can be obtained in approximate form from the formula $\beta=(3n)/(n-0.63)$, with $n=b/h$, or else from tables available in technical manuals known to the person skilled in the art, for example, a table of the type appearing below.

| b/h | 1 | 1.5 | 1.75 | 2 | 2.5 | 3 | 4 | 6 | 8 | 10 | >10 |
|---|---|---|---|---|---|---|---|---|---|---|---|
| β | 7.09 | 5.10 | 4.67 | 4.37 | 4.02 | 3.72 | 3.56 | 3.34 | 3.26 | 3.19 | 3 |

To return to FIG. 2, a first end 56a of the first deformable element 56 is fixed with respect to the first structural region 44, whereas a first end 58a of the second deformable element 58 is fixed with respect to the second structural region 46. Furthermore, a second end 56b of the first deformable element 56 and a second end 58b of the second deformable element 58 are fixed with respect to the first and second connection regions 55, 57, respectively.

According to an embodiment, in resting conditions, each of the first and second deformable elements 56, 58 has a shape of a parallelepiped, the dimension of which parallel to the axis X is greater than the corresponding dimensions along the axes Y and Z; for example, the dimension parallel to the axis X is at least five times greater than the dimensions along the axes Y and Z. In resting conditions, each of the first and second deformable elements 56, 58 has two faces.

For practical purposes, the first and second deformable elements 56, 58 function, respectively, as first and second springs, since each of them can undergo a torsion about the axis O, and subsequently return to the position assumed in resting conditions. During torsion of the first and second deformable elements 56, 58, the two faces thereof that, in the resting condition, are arranged in planes parallel to the plane XY, are shifted with respect to the resting position, given that they rotate about the axis O. In fact, the shape of the first and second deformable elements 56, 58 bestows upon them a low torsional stiffness, for example, comprised between $10^{-4}$ and $10^{-3}$ N·m/rad. The mobile element 60 and the mirror 65 are thus designed to rotate, in use, about the axis O.

Instead, as has been said previously, the first and second connection regions 55, 57 have a high torsional stiffness, for example, comprised between $10^{-1}$ and 1 N·m/rad.

In the embodiment illustrated in FIG. 2, the mobile body 54 has notches 61 and 62, in particular symmetrical with respect to the axis O. Each notch 61, 62 has a length L, and a width P. The thickness, along Z, of each notch 61, 62 is equal to the thickness, along Z, of the mobile body 54.

In any case, the notches 61, 62 extend so that respective first terminal portions 61a, 62a are at a distance apart, measured along the axis Y, equal to or greater than the width, measured along the axis Y, of the first connection region 55. Likewise, the notches 61, 62 moreover extend so that respective second terminal portions 61b, 62b are at a distance apart, measured along the axis Y, equal to or greater than the width, measured along the axis Y, of the second connection region 57. In this way, the central portion 60 that houses the mirror layer 65 is connected to the first and second deformable elements 56, 58 by portions made of semiconductor material having a width, along Y always equal to or greater than the width, along Y, of the first and second connection regions 55, 57. There is thus always guaranteed a rigid coupling of the central portion 60 with the first and second deformable elements 56, 58.

In the embodiment illustrated in FIG. 2, each notch 61, 62 has, in top plan view, an arched curved shape that follows the circular profile of the perimeter edge of the mobile body 54. Each notch 61, 62 cuts through the mobile body 54 along its entire thickness, thus defining frame regions 66, 68 that are separated from the central portion 60, and thus from the mirror layer 65, by the notch 61, 62, but are connected to the first connection region 55 and to the second connection region 57. Thus, the frame regions 66, 68 are coupled to the central portion 60 by the first and second connection regions 55, 57.

According to an aspect of the present disclosure, a first actuator 70 and a second actuator 72, of a piezoelectric type, are arranged in the frame regions 66, 68. The first and second actuators 70, 72 extend following the curvature of the mobile body 54 and are symmetrical with respect to the axis O. The first and second actuators 70, 72 include a layer made of piezoelectric material set between control electrodes (not illustrated), in a per se known manner. In FIG. 2, the first and second actuators 70, 72 are illustrated with a dashed line in so far as, according to an embodiment, they are coated with a protective and electrically insulating layer, for example, made of dielectric material, such as silicon oxide. Since, in use, the first and second actuators 70, 72 have the function of triggering and maintaining the oscillation of the mobile body 54, each of them extends, in an embodiment, symmetrical with respect to an axis K passing through the centroid of the mobile body 54 (i.e., through the point of intersection between the axes O and H) and orthogonal to both of the axes O and H. In this way, no uncontrolled oscillations are generated, caused by a possible asymmetry of the actuators.

In use, when a driving voltage $V_1$ is applied to the first actuator 70, a local deformation of the frame region 66 is generated, which is directly transferred to the first and second connection regions 55, 57, imparting a rotation on the mobile body 54 about the axis O, thanks to the torsion of just the deformable elements 56, 58.

Likewise, when a driving voltage $V_2$ is applied to the second actuator 72, a local deformation of the frame region 68 is generated that is directly transferred to the first and second connection regions 55, 57, imparting a rotation on the mobile body 54 about the axis O, thanks to the torsion of just the deformable elements 56, 58.

Figure 3:
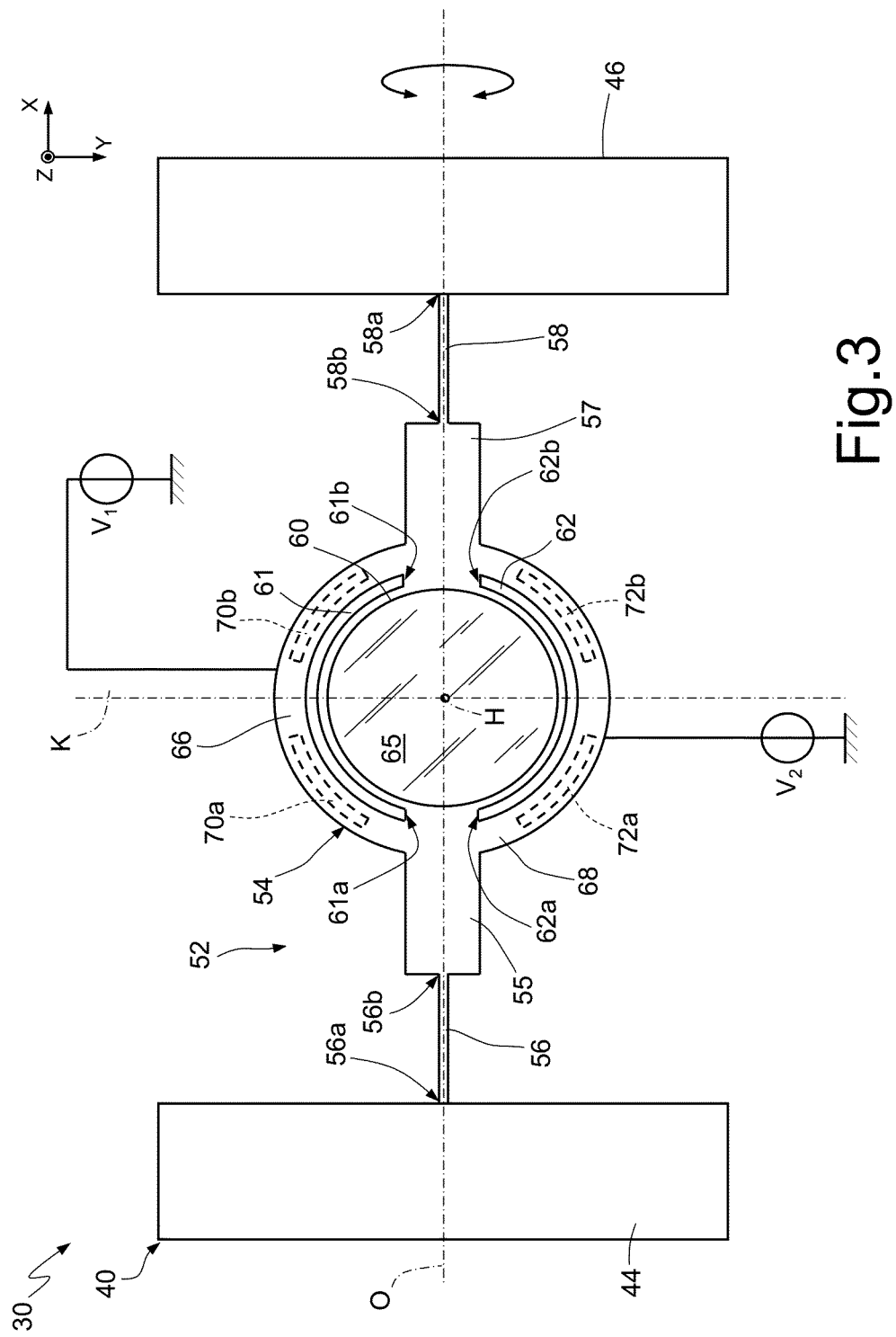
FIG. 3 shows, in top plan view, an oscillating structure according to a further aspect of the present disclosure.

FIG. 3 shows, according to a further embodiment of the present disclosure, a MEMS device 30'; elements in common between the MEMS device 30 of FIG. 2 and the MEMS device 30' of FIG. 3 are designated by the same reference numbers and are not described any further herein.

In the embodiment of FIG. 3, the first and second actuators 70, 72 are formed, respectively, by a plurality of piezoelectric sub-elements 70a, 70b and 72a, 72b. The piezoelectric sub-elements 70a, 70b extend symmetrically to one another with respect to the axis K, like the piezoelectric sub-elements 72a, 72b. Furthermore, the piezoelectric sub-element 70a is symmetrical to the piezoelectric sub-element 72a with respect to the axis O, and the piezoelectric sub-element 70b is symmetrical to the piezoelectric sub-element 72b with respect to the axis O.

In use, the driving voltage $V_1$ is applied to both of the piezoelectric sub-elements 70a, 70b, thus generating a local deformation of the frame region 66, which is directly transferred to the first and second connection regions 55, 57, imparting a rotation on the mobile body 54 about the axis O, thanks to the torsion of just the deformable elements 56, 58.

Likewise, the driving voltage $V_2$ is applied to both of the piezoelectric sub-elements 72a, 72b, thus generating a local deformation of the frame region 68, which is directly transferred to the first and second connection regions 55, 57, imparting a rotation on the mobile body 54 about the axis O, thanks to the torsion of just the deformable elements 56, 58.

It is evident that, according to further embodiments (not illustrated), it is possible to form a larger number of piezoelectric sub-elements for each actuator.

In an embodiment of the present disclosure, in particular as illustrated in FIG. 2 or FIG. 3, the central portion 60, the first and second connection regions 55, 57, the frame regions 66, 68, the first and second deformable elements 56, 58, and the first and second structural regions 44, 46 form a single piece; i.e., they belong to a monolithic structure, in particular made of semiconductor material obtained using known micromachining techniques. More in particular, the central portion 60, the first and second connection regions 55, 57, and the frame regions 66, 68 are coplanar with respect to one another.

The first and second actuators 70, 72 include, in a per se known manner, a layer made of piezoelectric material, such as PVDF (polyvinylidene fluoride) or PZT (lead zirconate titanate), set between titanium/platinum electrodes, to form a stack. The first and second actuators 70, 72 are insulated from the layer of semiconductor material of the frame regions 66, 68 by a dielectric layer, such as silicon oxide, and are moreover coated with a further dielectric layer, for example of silicon oxide, acting as protective and electrically insulating layer. Electrical connections, for example, in the form of conductive paths, extend in electrical contact with the electrodes of the first and second actuators 70, 72, for supplying the driving voltages $V_1$ and $V_2$, respectively.

FIGS. 4-10 are schematic illustrations of manufacturing steps for obtaining the MEMS device 30 of FIG. 2. The views of FIGS. 4-10 are side views, taken along a line of section coinciding with the axis K of FIG. 2.

Figure 4:
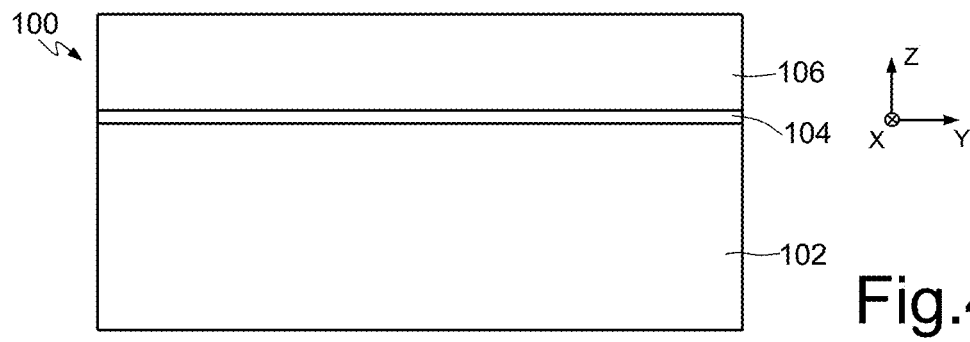
FIGS. 4-10 show, in lateral cross-sectional view, steps for manufacturing the oscillating structure of FIG. 2.
Figure 5:
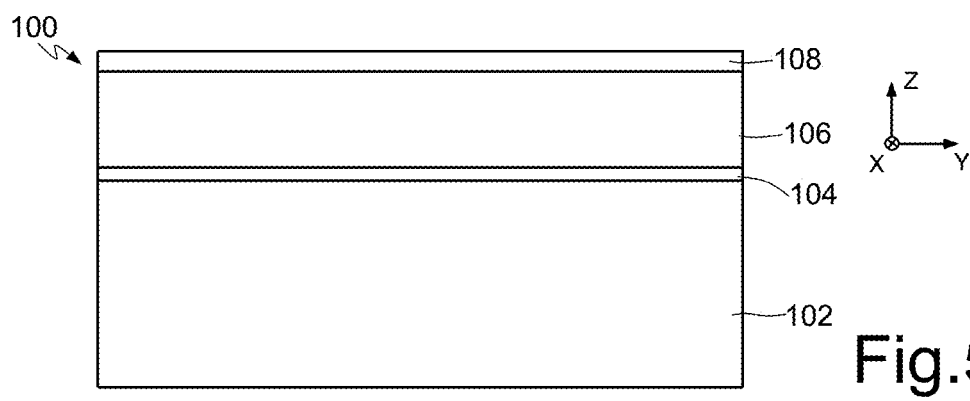
Figure 6:
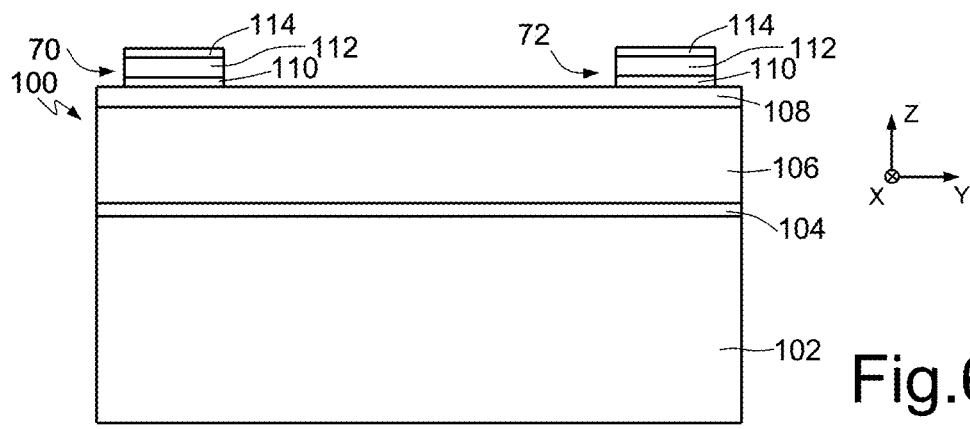

With reference to FIG. 4, a wafer 100 is provided, for example of a SOI (Silicon Over Insulator) type, including a substrate 102 made of semiconductor material, such as silicon, an insulating layer 104, for example, of silicon oxide, which extends over the substrate 102, and a structural layer 106, which extends over the insulating layer 104.

Then (FIG. 5), a further insulating layer 108 is formed, made for example of silicon oxide formed by thermal oxidation, on the structural layer 106.

This is followed (FIG. 6) by formation of the first and second actuators 70, 72, in a per se known manner, i.e., by depositing in succession a first electrode layer 110, a piezoelectric layer 112, and a second electrode layer 114, so that the piezoelectric layer 112 is sandwiched between the electrode layers 110, 114. The first and second actuators 70, 72 are then patterned by lithographic and etching steps.

Figure 7:
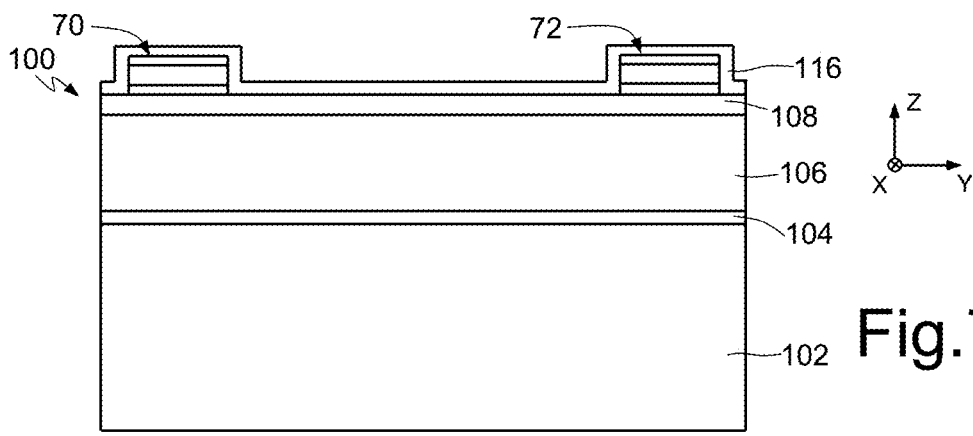

With reference to FIG. 7, there follows a step of deposition, on the wafer 100, of a dielectric layer 116 for protection of the first and second actuators 70, 72.

The dielectric layer 116 is then selectively removed from regions of the first and second actuators 70, 72 where openings for electrical access to the first and second actuators 70, 72 are to be formed (for contact of the electrodes 110, 114), and from regions of the wafer 100 where the mirror layer 65 is to be formed.

This is followed by a step of deposition, and subsequent lithographic and etching steps, of conductive material, to form electrical contacts 118, 120 at the first and second actuators 70, 72. A step of deposition, and subsequent lithographic and etching steps, of reflecting material (e.g., aluminum or gold) to form the mirror layer 65, is moreover carried out. The steps of formation of the electrical contacts 118, 120 and of the mirror layer 65 can be performed simultaneously. In this case, the electrical contacts 118, 120 will be made of the same material as the one chosen for the mirror layer 65.

Then (FIG. 9), the structural layer 106 is etched for removing selective portions of the structural layer 106 in the regions where the notches 61, 62 are to be formed. In addition, moreover defined in this step is the desired shape of the mobile body 54 and of the first and second connection regions 56, 58. Etching of the structural body 106 proceeds until the insulating layer 104 is reached, which has, in this context, the function of etch-stop layer.

Then (FIG. 10), there follows a step of back-etching of the wafer 100, to remove selective portions of the substrate 102 and of the insulating layer 104 underneath the mobile body 54 and of the first and second connection regions 56, 58, thus releasing the MEMS structure, which can move according to its own degrees of freedom.

According to an aspect of the present disclosure, it is possible to form, optionally, an annular structure 122 underneath the central portion 60. The annular structure 122 is formed by portions of the substrate 102 and of the insulating layer 104 during the step of selective etching thereof discussed above. The annular structure 122 has the function of mechanical reinforcement of the structure 106, reducing deformation thereof during oscillation.

The MEMS device 30 of FIG. 2 is thus formed.

Figure 11A:
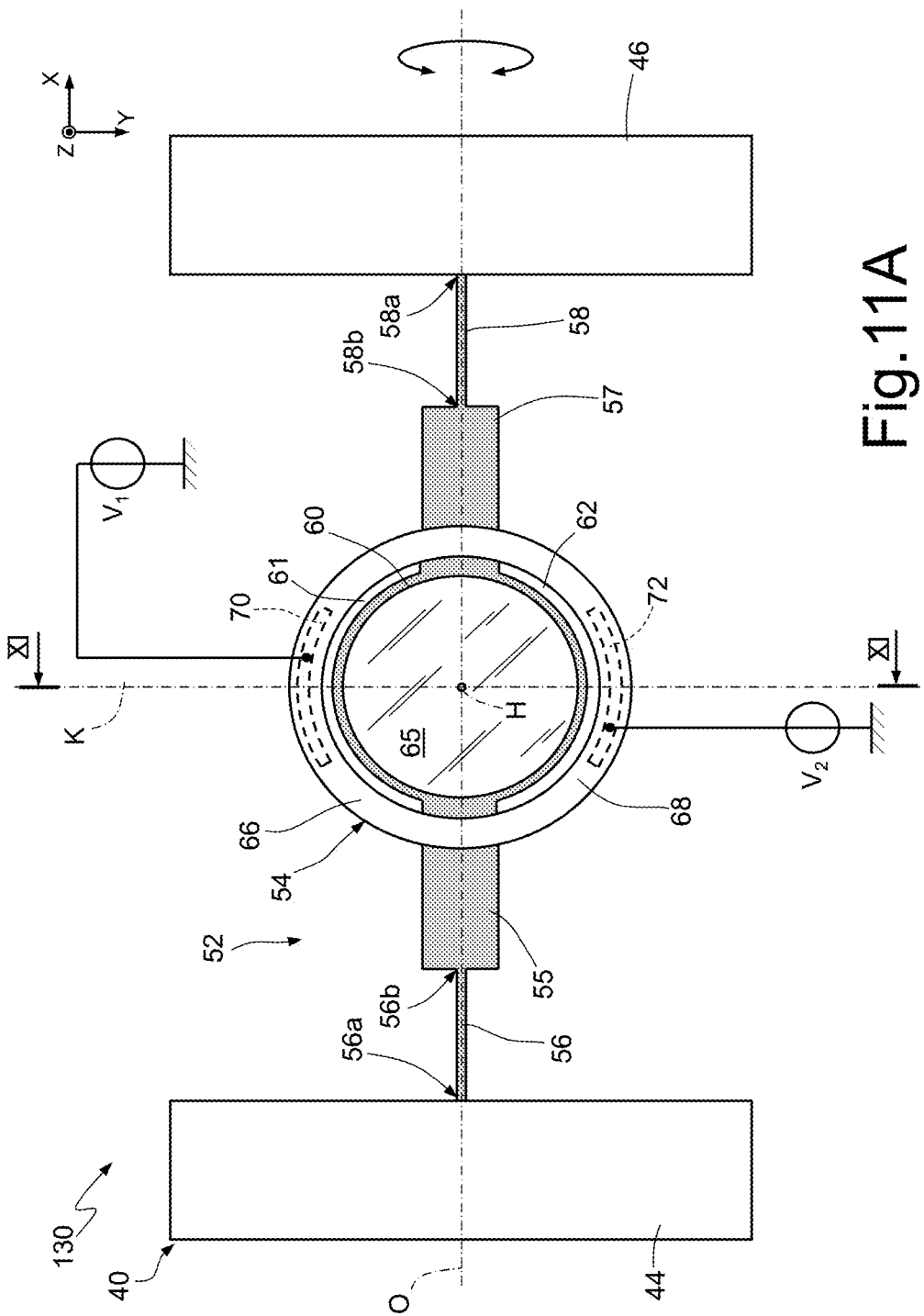
FIGS. 11A and 11B show, in top plan view and in lateral cross-sectional view respectively, an oscillating structure according to a further aspect of the present disclosure.
Figure 11B:
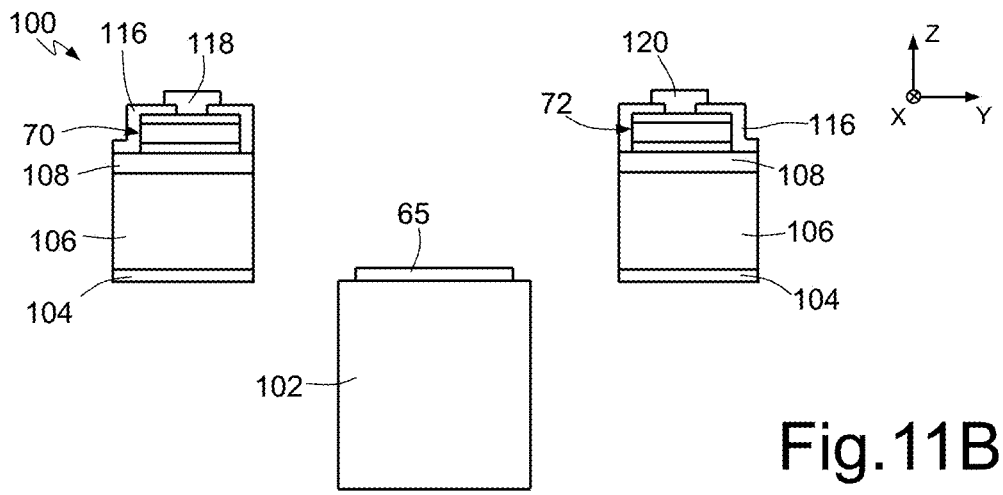

In a further embodiment of the present disclosure, illustrated in FIG. 11A in top plan view and in FIG. 11B in cross-sectional view along the line of section XI-XI of FIG. 11A, a MEMS device 130 comprises frame regions 66, 68, which extend over a plane different from, and parallel to, the plane of lie of the central portion 60 and of the first and second connection regions 55, 57. More in particular, the frame regions 66, 68 extend above the central portion 60 and the first and second connection regions 55, 57.

Figure 12:
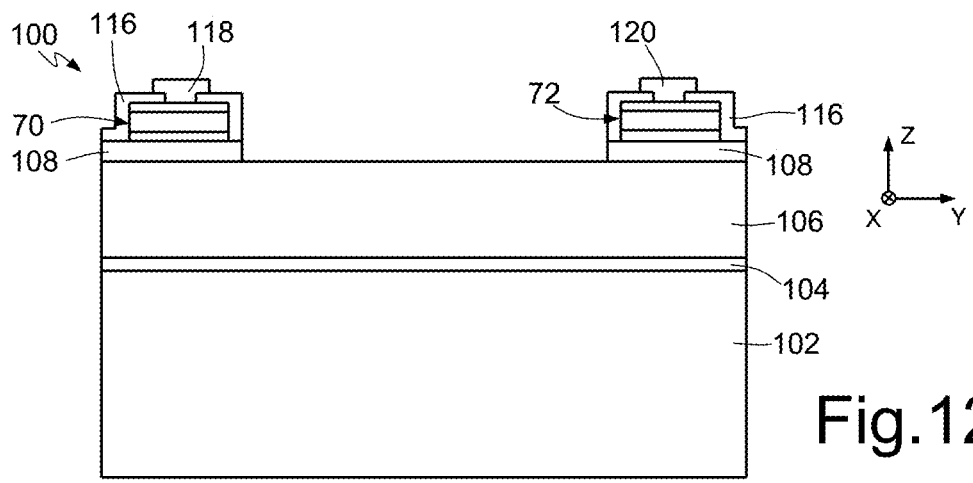
FIGS. 12 and 13 show, in lateral cross-sectional view, intermediate manufacturing steps for obtaining the oscillating structure of FIGS. 11A and 11B.
Figure 13:
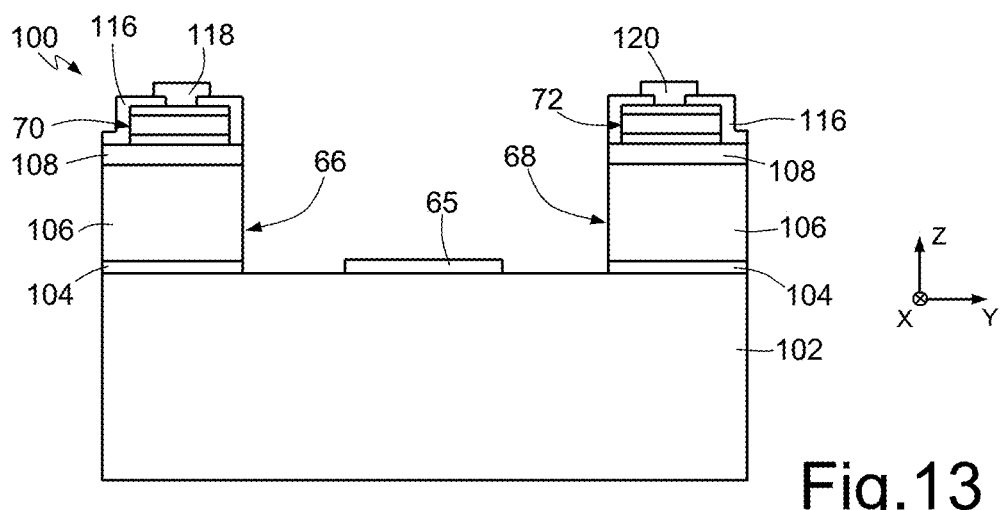

FIGS. 12 and 13 show intermediate manufacturing steps for obtaining the MEMS device 130 of FIGS. 11A and 11B.

Manufacture of the MEMS device 130 envisages carrying out the steps already illustrated in FIGS. 4-7 and described with reference thereto. The step of FIG. 12 is consequently subsequent to the step of FIG. 7.

Figure 8:
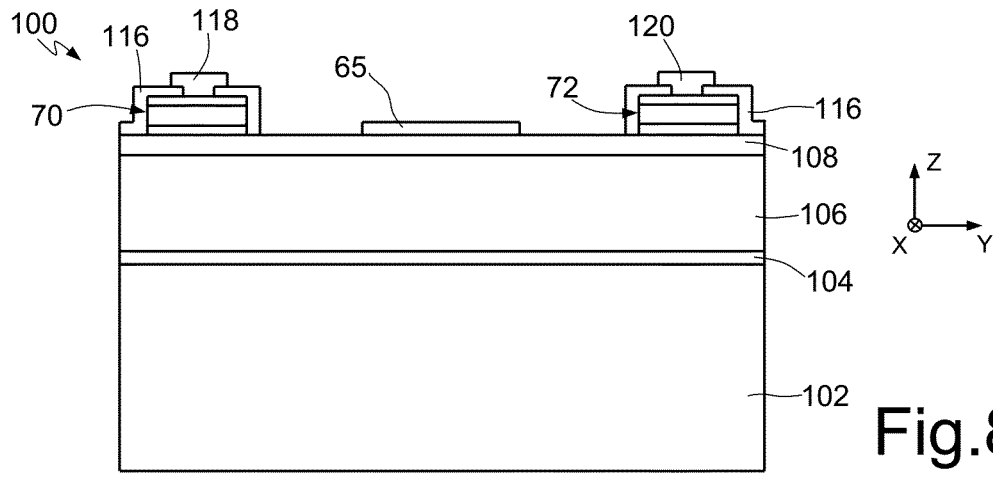
Figure 9:
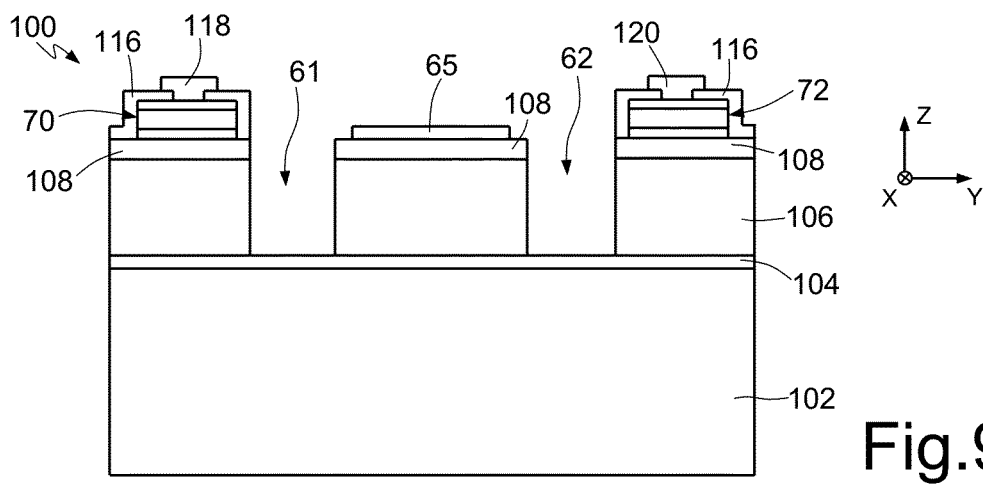
Figure 10:
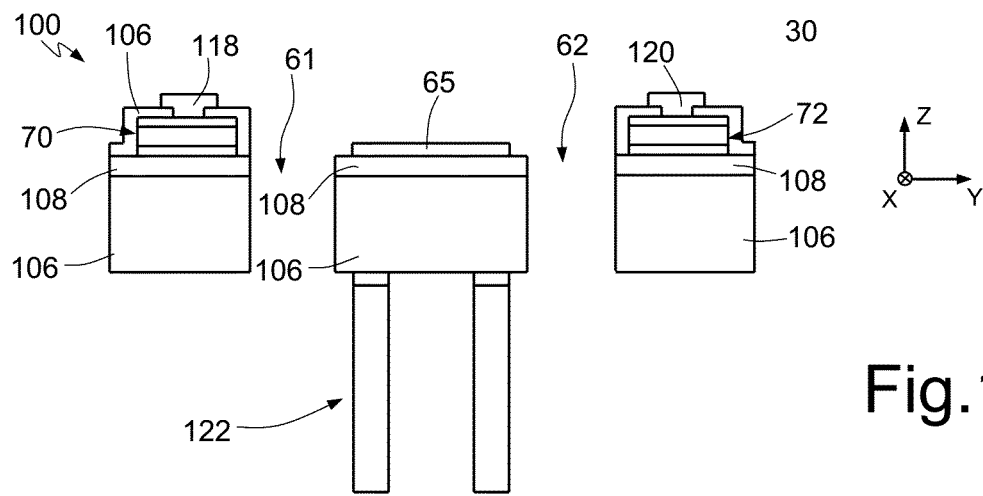

With reference to FIG. 12, after forming the electrical contacts 118 and 120, in a way similar to what has been described with reference to FIG. 8, a step of etching of selective portions of the insulating layer 108 is carried out for removing the latter from the wafer 100, except for the portions thereof that extend underneath the actuators 70, 72. Surface regions of the structural layer 106 are thus exposed.

Then (FIG. 13), the structural layer 106 is patterned (by lithography and etching) to form the frame regions 66, 68. It may be noted that, as is clearly visible from FIG. 11A, in this embodiment the frame regions 66, 68 are connected together and form a monolithic annular path. The etching proceeds, possibly with a different etching chemistry, also on the underlying insulating layer 104, exposing surface regions of the substrate 102.

Then, deposited on the wafer 100 is a layer of reflecting material, for example, aluminum or gold, which is patterned by lithographic and etching steps in order to form the mirror layer 65. The mirror layer 65 extends, in this embodiment, over the surface of the substrate 102.

Finally, a step of back-etching of the substrate 102 is carried out to release the MEMS structure, so rendering it free to oscillate according to its own degrees of freedom. There is thus obtained the MEMS device 130 of FIG. 11B. Simultaneously with the step of etching of the substrate 102, the central portion 60, the first and second connection regions 55, 57, and the deformable elements 56, 58 are defined. In other words, the central portion 60, the first and second connection regions 55, 57, and the deformable elements 56, 58 are formed by appropriately patterned portions of the substrate 102, whereas the frame regions 66, 68 fixedly form with respect to one another a single ring obtained by patterning the structural layer 106.

As may be noted from FIGS. 11A, 11B, and 13, the first and second actuators 70, 72 extend over a plane raised with respect to the plane in which the mirror layer 65 extends. The first and second actuators 70, 72 moreover extend in a plane raised with respect to the plane of lie of the substrate 102, but rigidly connected thereto.

In a further embodiment of the present disclosure (illustrated in FIG. 14A in top plan view and in FIG. 14B in cross-sectional view along the line of section XIV-XIV of FIG. 14A), a MEMS device 150 comprises frame regions 66, 68 that extend in a plane different from, and parallel to, the plane of lie of the central portion 60 and of the first and second connection regions 55, 57. More in particular, the frame regions 66, 68 extend underneath the central portion 60 and the first and second connection regions 55, 57.

Figure 14A:
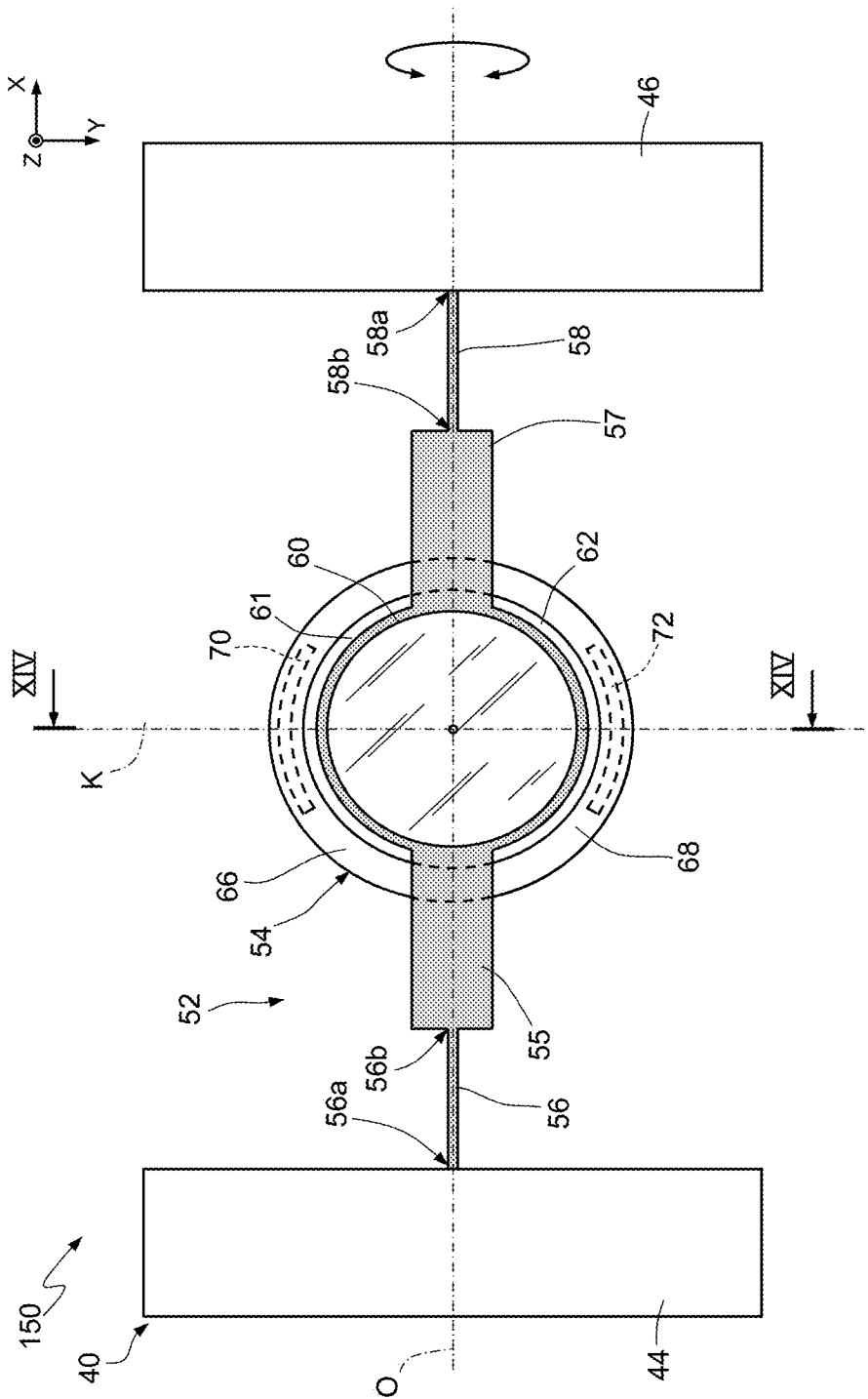
FIGS. 14A and 14B show, in top plan view and in lateral cross-sectional view respectively, an oscillating structure according to a further aspect of the present disclosure.
Figure 14B:
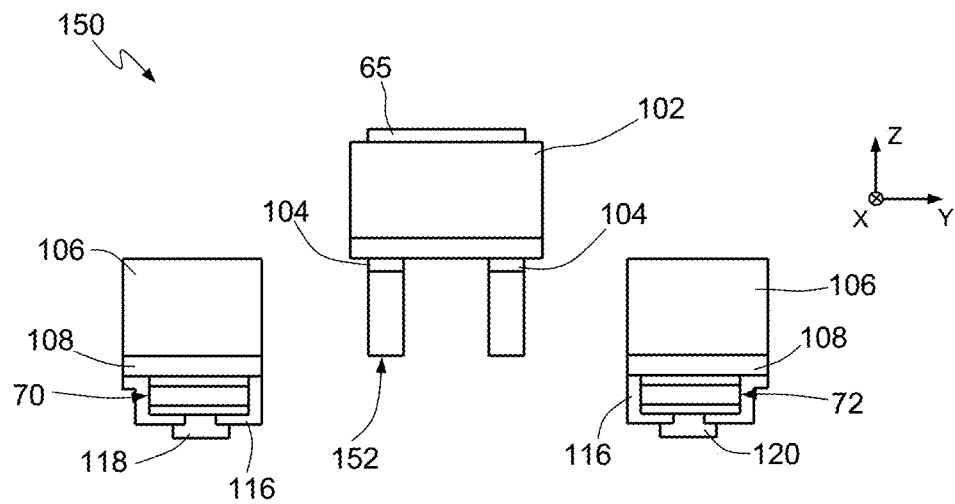
Figure 15:
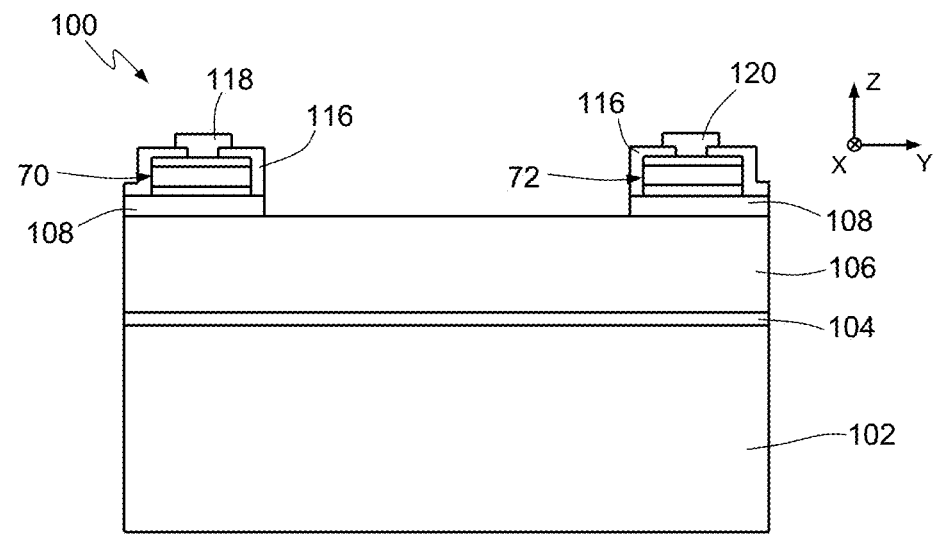
FIGS. 15-17 show, in lateral cross-sectional view, intermediate manufacturing steps for obtaining the oscillating structure of FIGS. 14A and 14B.
Figure 16:
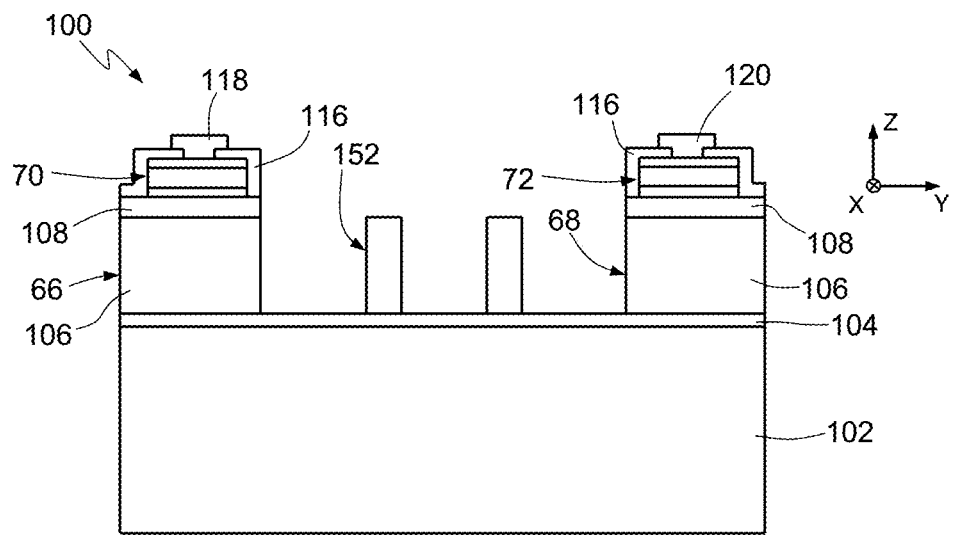
Figure 17:
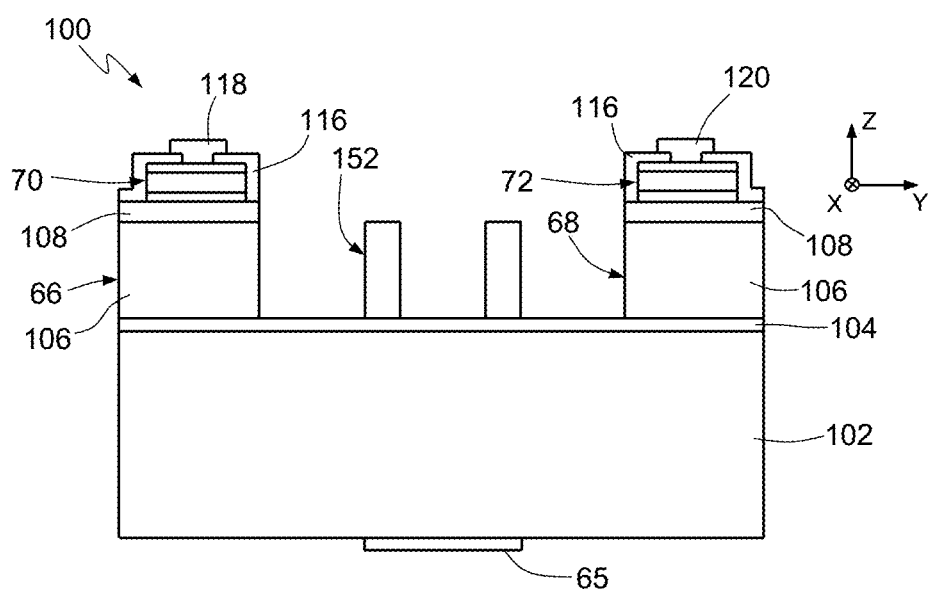

FIGS. 15-17 show intermediate manufacturing steps for obtaining the MEMS device 150 of FIGS. 14A and 14B.

Manufacture of the MEMS device 150 envisages carrying out the steps already illustrated in FIGS. 4-7 and described with reference thereto. The step of FIG. 15 is consequently subsequent to the step of FIG. 7.

With reference to FIG. 15, after forming the electrical contacts 118 and 120 in a way similar to what has been described with reference to FIG. 8, a step of etching of selective portions of the insulating layer 108 is carried out for removing the latter from the wafer 100, except for the regions underlying the first and second actuators 70, 72. Surface regions of the structural layer 106 are thus exposed.

Next (FIG. 16), the structural layer 106 is patterned for removing selective portions thereof, to form the frame regions 66, 68. It may be noted that, as is clearly visible from FIG. 14A, the frame regions 66, 68 are connected together and form a monolithic annular path. Optionally, in this step of the process, it is moreover possible to form an annular structure 152 that extends over the insulating layer 104. The annular structure 152 is similar to the annular structure 122 and is formed by portions of the structural layer 106 and of the insulating layer 104 during the step of selective etching thereof, discussed above. The annular structure 152 has the same function as the annular structure 122.

Then (FIG. 17), there follows a step of deposition of a layer of reflecting material on the back of the wafer 100, and subsequent patterning to form the mirror layer 65 of FIG. 14A. The mirror layer 65 is formed, in particular, on the annular structure 152 (if present), i.e., overlying it when observed in the plane XY.

This is followed by steps of removal of selective portions of the substrate 102, for releasing the MEMS structure, rendering it free to oscillate according to its own degrees of freedom.

The wafer 100 is rotated, thus obtaining the MEMS device 150 of FIG. 14B. Simultaneously with the step of etching of the substrate 102, the central portion 60, the first and second connection regions 55, 57, and the deformable elements 56, 58 are defined. In other words, the central portion 60, the first and second connection regions 55, 57, and the deformable elements 56, 58 are formed by appropriately patterned portions of the substrate 102, whereas the frame regions 66, 68 form fixedly with respect to one another a single ring obtained by patterning the structural layer 106.

As may be noted from FIGS. 11A, 11B, and 13, the first and second actuators 70, 72 extend in a plane lowered with respect to the plane in which the mirror layer 65 extends. The first and second actuators 70, 72 moreover extend in a plane lowered with respect to the plane of lie of the substrate 102, but rigidly connected thereto.

FIG. 18 shows a MEMS device 160 according to a further embodiment of the present disclosure. Elements of the MEMS device 160 in common with those of the MEMS devices 30, 30', 130 and 150 are designated by the same reference numbers.

The MEMS device 160 does not have the frame regions 66, 68. The MEMS device 160 has, instead, a first cantilever structure 162 and a second cantilever structure 164, which are fixed with respect to the first coupling region 55 and the second coupling region 57, respectively. The first and second cantilever structures 162, 164 have, in a view in the plane XY, a rectangular shape with its main extension in the direction Y. The first cantilever structure 162 has two end terminals 162a, 162b, where a first actuator 168a and a second actuator 168b, of a piezoelectric type extend. Likewise, the second cantilever structure 164 has two end terminals 164a, 164b, where a third actuator 169a and a fourth actuator 169b of a piezoelectric type extend.

In use, the driving voltage $V_1$ is applied to both the first and third actuators 168a, 169a, thus generating a local deformation of the first and second cantilever structures 162, 164, which is directly transferred to the first and second connection regions 55, 57, imparting a rotation on the mobile body 54 about the axis O thanks to the torsion of just the deformable elements 56, 58.

Likewise, the driving voltage $V_2$ is applied to both the second actuator 168b and the fourth actuator 169b, thus generating a respective local deformation of the first and second cantilever structures 162, 164, which is directly transferred to the first and second connection regions 55, 57, imparting a rotation on the mobile body 54 about the axis O thanks to the torsion of just the deformable elements 56, 58.

It is evident that, according to further embodiments, the cantilever structures 162, 164 may have shapes different from the rectangular shape, for example any polygonal shape.

The MEMS device, according to any of the embodiments of the present disclosure, further comprises an electronic control circuit (not illustrated), designed to start, and then maintain, oscillation of the mobile body 54.

The electronic control circuit is configured to generate, in a per se known manner, the driving voltages $V_1$, $V_2$ in the form, for example, of pulses. When a pulse is applied to the first actuator 70 or to the second actuator 72, the latter reacts, causing a curving of the respective frame region 66, 68 with respect to which it is fixed. This curving action is directly transferred to the first and second coupling regions 55, 57 and, thus, to the first and second deformable elements 56, 58, thus generating a torsion thereof. In other words, a torque is generated, which keeps the mobile body 54 in oscillation.

According to an embodiment, the mobile body 54 is made to oscillate at its resonance frequency.

In use, according to an embodiment, assuming that the mobile body 54 is oscillating and is at an angular distance $+\theta_{max}$, application to the first actuator 70 or to the second actuator 72 of a first electrical pulse causes generation of a torque that tends to bring the mobile element 60 back into the resting position, with consequent reduction of the torsion to which the first and second deformable elements 56, 58 are subjected. Once the resting position is reached, application of the torque ceases, but the mobile body 60, on account of its own inertia, passes beyond the resting position, until an angular distance $-\theta$ is reached, where a second electrical pulse is applied to the other one between the first and second actuators 70, 72. There is thus generated a further torque, which tends to bring the mobile body 60 back into the resting position, and so forth. The electrical pulses are thus distributed in time for keeping the mobile body 60 in oscillation about the axis O.

The electronic control circuit moreover manages triggering of the oscillation of the mobile body 54, starting from a state where the latter is stationary in resting condition.

Finally, it is clear that modifications and variations may be made to what has been described and illustrated herein, without thereby departing from the sphere of protection of the present invention, as defined in the annexed claims.

Furthermore, the present invention has been described, purely by way of example, with reference to the case of a MEMS device designed to reflect an optical beam in an electronically controllable way, and thus including at least a mirror. However possible are other uses of the MEMS device described hereinafter. In general, the present invention can be applied to a different oscillating system, for example, MEMS resonators for generation of clock signals.

Furthermore, the variant described with reference to FIG. 3 applies indifferently also to the embodiments described with reference to FIGS. 11a and 14a.

Moreover, in the foregoing description and in the figures, the frames 66, 68 have always been illustrated and described as being circular in shape. It is evident that they may, however, have a different shape, for example, defining an oval path, or some other curvilinear path, or even a square path.

In addition, according to a further embodiment, the actuators 70 and 72 may not be present simultaneously. In this case, the MEMS device has only one between the first actuator 70 and the second actuator 72. Likewise, in the case of the embodiment of FIG. 3, just a pair of the actuators 70a, 70b and 72a, 72b may be present.

It is moreover possible for the projective system 20 of FIG. 1 to include, in addition to the MEMS device according to any embodiment of the present disclosure, also an additional MEMS device, set between the MEMS device 30 and the screen 32 and designed to receive the reflected optical beam OB2, to generate a further reflected optical beam, and to send this further reflected optical beam onto the screen 32. In this way, it is possible to scan the screen 32 with the aforesaid further reflected optical beam in a first direction and a second direction, for example, orthogonal to one another.

The MEMS device 30 may likewise include also a movement device, for example of an electromagnetic type, designed to rotate the mobile element 60, and thus the mirror 65, about a further axis parallel, for example, to the axis Y.

Finally, it is possible for at least one of the first and second deformable elements to be made of a material different from a semiconductor, such as, for example, a metal.

The invention claimed is:

1. An oscillating structure with piezoelectric actuation, comprising:
   a first torsional elastic element and a second torsional elastic element constrained to respective portions of a fixed supporting body and defining an axis of rotation;
   a mobile element arranged between, and connected to, said first and second torsional elastic elements, the mobile element being rotatable about the axis of rotation as a consequence of a torsion of the first and second torsional elastic elements;
   wherein said mobile element comprises a central body, a first connection region between the central body and the first torsional elastic element, and a second connection region between the central body and the second torsional elastic element;
   wherein each of the first and second connection regions has a constant of torsional stiffness higher than a constant of torsional stiffness of each of the first and second torsional elastic elements; and
   a first control region coupled to the mobile element and housing a first piezoelectric actuator that is configured to cause, in use, a local deformation of the first control region that generates the torsion of the first and second torsional elastic elements;
   wherein said first control region is fixed with respect to the first and second connection regions and separated from the central body by a first trench.

2. The oscillating structure according to claim 1, wherein the constant of torsional stiffness of each of the first and second connection regions is at least an order of magnitude greater than the constant of torsional stiffness of each of the first and second torsional elastic elements.

3. The oscillating structure according to claim 1, wherein the central body houses a mirror, said oscillating structure forming a micro-mirror.

4. The oscillating structure according to claim 1, further comprising a second control region coupled to the mobile element and housing a second piezoelectric actuator configured to cause, in use, a local deformation of the second control region that generates a torsion of the first and second torsional elastic elements that is opposite to the torsion of the first and second torsional elastic elements.

5. The oscillating structure according to claim 4, wherein said second control region is fixed with respect to the first and second connection regions and separated from the central body by a second trench.

6. The oscillating structure according to claim 4, wherein the first and second control regions are coplanar with the mobile element.

7. The oscillating structure according to claim 4, wherein the first and second control regions extend in a plane parallel to a plane in which the mobile element lies, at a height different than the plane in which the mobile element lies.

8. The oscillating structure according to claim 4, wherein the first and second control regions extend in a plane parallel to a plane in which the mobile element lies, at a height different than the plane in which the mobile element lies.

9. The oscillating structure according to claim 1, further comprising an electronic circuit operatively coupled to the first piezoelectric actuator, configured to bias the first piezoelectric actuator at a driving voltage such as to generate and maintain an oscillation of the mobile element.

10. The oscillating structure according to claim 1, further comprising a reflecting element constrained to the mobile element and configured to reflect a light beam.

11. A projective MEMS system, comprising:
    an oscillating structure comprising:
    a first torsional elastic element and a second torsional elastic element constrained to respective portions of a fixed supporting body and defining an axis of rotation;
    a mobile element arranged between, and connected to, said first and second torsional elastic elements, the mobile element being rotatable about the axis of rotation as a consequence of a torsion of the first and second torsional elastic elements;
    wherein said mobile element comprises a central body, a first connection region between the central body and the first torsional elastic element, and a second connection region between the central body and the second torsional elastic element;
    wherein each of the first and second connection regions has a constant of torsional stiffness higher than a constant of torsional stiffness of each of the first and second torsional elastic elements;
    a first control region coupled to the mobile element and housing a first piezoelectric actuator that is configured to cause, in use, a local deformation of the first control region that generates the torsion of the first and second torsional elastic elements;
    wherein said first control region is fixed with respect to the first and second connection regions and separated from the central body by a first trench; and
    a reflecting element, constrained to the mobile element, designed to reflect a light beam;
    a light source that can be operated for generating the light beam; and
    an image-generating module, operatively coupled to said oscillating structure, for generating part of an image associated to a light beam reflected by said reflecting element.

12. A method for manufacturing an oscillating structure with piezoelectric actuation, comprising the steps of:
    forming a first torsional elastic element and a second torsional elastic element constrained to respective portions of a fixed supporting body and defining an axis of rotation;
    forming a mobile element between, and connected to, said first and second torsional elastic elements, the mobile element being rotatable about the axis of rotation as a consequence of a torsion of the first and second torsional elastic elements;
    wherein forming said mobile element comprises forming a central body, forming a first connection region between the central body and the first torsional elastic element, and forming a second connection region between the central body and the second torsional elastic element, the first and second connection regions being formed with a constant of torsional stiffness greater than the constant of torsional stiffness of each of the first and second torsional elastic elements;
    forming a first control region coupled to the mobile element, wherein forming said first control region includes forming the first control region fixed with respect to the first and second connection regions and forming a trench for separating the first control region from the central body; and forming a first piezoelectric actuator coupled to the first control region and configured to cause, in use, a local deformation of the first control region that generates the torsion of the first and second torsional elastic elements.

13. The method according to claim 12, further comprising the step of patterning each of the first and second connection regions so that they have a respective constant of torsional stiffness at least one order of magnitude higher than the constant of torsional stiffness of each of the first and second torsional elastic elements.

14. The method according to claim 12, further comprising a step of forming a second control region, the step of forming the second control region including: forming the second control region fixed with respect to the first and second connection regions; and forming a second trench for separating the second control region from the central body.

15. The method according to claim 12, wherein forming the central body includes depositing a mirror layer, so that said oscillating structure forms a micro-mirror.

16. The method according to claim 12, further comprising the steps of:
forming a second control region coupled to the mobile element; and
forming a second piezoelectric actuator coupled to the second control region and configured to cause, in use, a local deformation of the second control region that generates a torsion of the first and second torsional elastic elements opposite to the torsion generated by the first piezoelectric actuator.

17. The method according to claim 16, wherein the steps of forming the first and second control regions are carried out simultaneously with the steps of forming the mobile element, said first and second control regions being formed coplanar with the mobile element.

18. The method according to claim 16, wherein the steps of forming the first and second control regions include photolithographically defining a layer of semiconductor material, which extends at a height different than a plane in which the mobile element lays.

19. An oscillating structure with piezoelectric actuation, comprising:
a mobile body including a central portion, a first rigid connection region and second rigid connection region on diametrically opposite sides of the central portion;
a first deformable element coupled between the first and second rigid connection regions and separated from the central portion by a first trench;
a second deformable element coupled between the first and second rigid connection regions and separated from the central portion by a second trench;
wherein the first and second deformable elements are located on diametrically opposite sides of the central portion;
a first torsional elastic element coupling the first rigid connection region to a first portion of a fixed supporting body;
a second torsional elastic element coupling the second rigid connection region to a second portion of the fixed supporting body;
wherein each of the first and second rigid connection regions has a constant of torsional stiffness higher by at least an order of magnitude than a constant of torsional stiffness of each of the first and second torsional elastic elements;
a first piezoelectric actuator supported by said first deformable element and configured to cause a local deformation of the first deformable element that generates a torsion of the first and second torsional elastic elements in a first direction; and
a second piezoelectric actuator supported by said second deformable element and configured to cause a local deformation of the second deformable element that generates a torsion of the first and second torsional elastic elements in a second direction opposite to the first direction.

20. The oscillating structure of claim 19, wherein said first trench has a first length which extends about substantially one-half of a periphery of the central portion, and wherein said second trench has a second length which extends about substantially one-half of the periphery of the central portion.

21. The oscillating structure of claim 19, further comprising a mirror mounted to an upper surface of the central portion.

22. The oscillating structure of claim 21, wherein the upper surface of the central portion is coplanar with an upper surface of the first rigid connection region and second rigid connection region.

23. The oscillating structure of claim 22, wherein an upper surface of the first and second deformable elements is offset from the upper surface of the central portion in a direction perpendicular thereto.

24. An oscillating structure with piezoelectric actuation, comprising:
a mobile body including a central portion, a first rigid connection region and second rigid connection region on diametrically opposite sides of the central portion;
a first deformable element coupled to the first rigid connection region;
a second deformable element coupled to the second rigid connection region;
wherein said mobile body further comprises a first connection region between the central portion and the first deformable element, and a second connection region between the central portion and the second deformable element;
a first torsional elastic element coupling the first rigid connection region to a first portion of a fixed supporting body;
a second torsional elastic element coupling the second rigid connection region to a second portion of the fixed supporting body;
wherein each of the first and second connection regions has a constant of torsional stiffness higher than a constant of torsional stiffness of each of the first and second deformable elements;
wherein a control region is fixed with respect to the first and second connection regions and separated from the central portion by a trench;
said first torsional elastic element, first rigid connection region, second torsional elastic element and second rigid connection region aligned along an axis of oscillation;
wherein the first and second deformable elements extend away from the first and second rigid connection regions, respectively, perpendicular to said axis of oscillation;
a first piezoelectric actuator supported by said first deformable element and configured to cause a local deformation of the first deformable element that generates a torsion of the first and second torsional elastic elements in a first direction; and
a second piezoelectric actuator supported by said second deformable element and configured to cause a local deformation of the second deformable element that generates a torsion of the first and second torsional elastic elements in a second direction opposite to the first direction.

\* \* \* \* \*

UNITED STATES PATENT AND TRADEMARK OFFICE
CERTIFICATE OF CORRECTION

PATENT NO. : 10,365,475 B2
APPLICATION NO. : 15/465742
DATED : July 30, 2019
INVENTOR(S) : Roberto Carminati et al.

It is certified that error appears in the above-identified patent and that said Letters Patent is hereby corrected as shown below:

In the Specification

At Column 10, Line number 17, please replace the term [[-θ]] with -- -$θ_{max}$ --.

Signed and Sealed this
Fifth Day of May, 2020

Andrei Iancu
*Director of the United States Patent and Trademark Office*